(12) United States Patent  
Chen et al.

(10) Patent No.: US 9,633,963 B2  
(45) Date of Patent: Apr. 25, 2017

(54) PACKAGING DEVICES AND METHODS OF MANUFACTURE THEREOF

(71) Applicant: Taiwan Semiconductor Manufacturing Company, Ltd., Hsin-Chu (TW)

(72) Inventors: Hsien-Wei Chen, Hsin-Chu (TW); Tsung-Yuan Yu, Taipei (TW); Hao-Yi Tsai, Hsin-Chu (TW); Mirng-Ji Lii, Sinpu Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/152,376

(22) Filed: May 11, 2016

(65) Prior Publication Data

US 2016/0254238 A1    Sep. 1, 2016

Related U.S. Application Data

(63) Continuation of application No. 13/894,107, filed on May 14, 2013, now Pat. No. 9,355,978.

(Continued)

(51) Int. Cl.
*H01L 21/00* (2006.01)
*H01L 23/00* (2006.01)
*H01L 23/498* (2006.01)

(52) U.S. Cl.
CPC ........ *H01L 24/13* (2013.01); *H01L 23/49838* (2013.01); *H01L 23/562* (2013.01); *H01L 24/02* (2013.01); *H01L 24/03* (2013.01); *H01L 24/05* (2013.01); *H01L 24/11* (2013.01); *H01L 24/10* (2013.01); *H01L 2224/0231* (2013.01); *H01L 2224/0235* (2013.01); *H01L 2224/0239* (2013.01); *H01L 2224/02311* (2013.01); *H01L 2224/02313* (2013.01); *H01L 2224/02331* (2013.01); *H01L 2224/0382* (2013.01);

(Continued)

(58) Field of Classification Search
CPC ...................................................... H01L 23/14
See application file for complete search history.

(56) References Cited

U.S. PATENT DOCUMENTS 6,392,163 B1    5/2002  Rinne et al.
6,777,815 B2    8/2004  Huang
(Continued)

FOREIGN PATENT DOCUMENTS

GB       2464549      4/2010
JP     2012023065     2/2012
(Continued)

*Primary Examiner* — William Harriston
(74) *Attorney, Agent, or Firm* — Slater Matsil, LLP

(57) ABSTRACT

Packaging devices and methods of manufacture thereof for semiconductor devices are disclosed. In some embodiments, a packaging device includes a contact pad disposed over a substrate, and a passivation layer disposed over the substrate and a first portion of the contact pad. A second portion of the contact pad is exposed. A post passivation interconnect (PPI) line is disposed over the passivation layer and is coupled to the second portion of the contact pad. A PPI pad is disposed over the passivation layer. A transition element is disposed over the passivation layer and is coupled between the PPI line and the PPI pad. The transition element includes a hollow region.

20 Claims, 7 Drawing Sheets

Related U.S. Application Data

(60) Provisional application No. 61/776,681, filed on Mar. 11, 2013.

(52) U.S. Cl.
CPC ............... *H01L 2224/03462* (2013.01); *H01L 2224/03464* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05548* (2013.01); *H01L 2224/05551* (2013.01); *H01L 2224/05552* (2013.01); *H01L 2224/05567* (2013.01); *H01L 2224/05624* (2013.01); *H01L 2224/05647* (2013.01); *H01L 2224/05655* (2013.01); *H01L 2224/05666* (2013.01); *H01L 2224/05671* (2013.01); *H01L 2224/11013* (2013.01); *H01L 2224/11334* (2013.01); *H01L 2224/11849* (2013.01); *H01L 2224/13* (2013.01); *H01L 2224/131* (2013.01); *H01L 2224/13014* (2013.01); *H01L 2224/13016* (2013.01); *H01L 2224/13022* (2013.01); *H01L 2224/13024* (2013.01); *H01L 2224/13109* (2013.01); *H01L 2224/13111* (2013.01); *H01L 2224/13116* (2013.01); *H01L 2224/13139* (2013.01); *H01L 2224/13147* (2013.01); *H01L 2224/215* (2013.01); *H01L 2924/014* (2013.01); *H01L 2924/01013* (2013.01); *H01L 2924/01022* (2013.01); *H01L 2924/01023* (2013.01); *H01L 2924/01024* (2013.01); *H01L 2924/01028* (2013.01); *H01L 2924/01029* (2013.01); *H01L 2924/0132* (2013.01); *H01L 2924/01074* (2013.01); *H01L 2924/01322* (2013.01); *H01L 2924/059* (2013.01); *H01L 2924/05042* (2013.01); *H01L 2924/05442* (2013.01); *H01L 2924/06* (2013.01); *H01L 2924/07025* (2013.01); *H01L 2924/10253* (2013.01); *H01L 2924/14* (2013.01); *H01L 2924/181* (2013.01); *H01L 2924/2064* (2013.01); *H01L 2924/20641* (2013.01); *H01L 2924/3512* (2013.01)

(56) References Cited

U.S. PATENT DOCUMENTS

| | | |
|---|---|---|
| 8,735,273 B2 | 5/2014 | Lu et al. |
| 2004/0053483 A1 | 3/2004 | Nair et al. |
| 2006/0138675 A1 | 6/2006 | Rinne |
| 2007/0284726 A1 | 12/2007 | Lin et al. |
| 2008/0128905 A1 | 6/2008 | Lee et al. |
| 2009/0079094 A1 | 3/2009 | Lin |
| 2011/0198753 A1 | 8/2011 | Holland |
| 2011/0272819 A1 | 11/2011 | Park et al. |
| 2013/0043583 A1 | 2/2013 | Wu et al. |
| 2014/0252601 A1 | 9/2014 | Lu et al. |
| 2014/0262468 A1 | 9/2014 | Chen et al. |
| 2014/0264846 A1 | 9/2014 | Chen et al. |
| 2014/0264884 A1 | 9/2014 | Chen et al. |

FOREIGN PATENT DOCUMENTS

| | | |
|---|---|---|
| KR | 1020090031293 | 3/2009 |
| KR | 1020110123526 | 11/2011 |
| KR | 1020130020512 | 2/2013 |
| TW | 479344 B | 3/2002 |
| TW | 498530 B | 8/2002 |
| TW | 200527625 A | 8/2005 |
| TW | I249822 B | 2/2006 | understand

PACKAGING DEVICES AND METHODS OF MANUFACTURE THEREOF

PRIORITY

This application is a continuation of, and claims the benefit of, U.S. patent application Ser. No. 13/894,107, filed on May 14, 2013, and entitled "Packaging Devices and Methods of Manufacture Thereof," which claims the benefit of U.S. Provisional Application No. 61/776,681, filed on Mar. 11, 2013, and entitled "Packaging Devices and Methods of Manufacture Thereof," which patent applications are incorporated herein by reference.

CROSS-REFERENCE TO RELATED APPLICATIONS

This application relates to the following co-pending and commonly assigned patent application: U.S. patent application Publication Ser. No. 13/492,285, filed on Jun. 8, 2012, entitled, "Methods and Apparatus of Packaging Semiconductor Devices," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post passivation interconnect (PPI) that is used to fan-out wiring for contact pads of the package so that electrical contacts can be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging devices and methods of manufacture thereof for semiconductor devices. Novel packaging devices will be described herein that include a novel transition element disposed between a post-passivation interconnect (PPI) line and a PPI pad that provides an area for a wetting region to form when a conductive material is coupled to the PPI pad or when the conductive material is re-flowed in a later packaging or manufacturing process, which improves reliability and prevents cracking of the conductive material joint.

Figure 1:
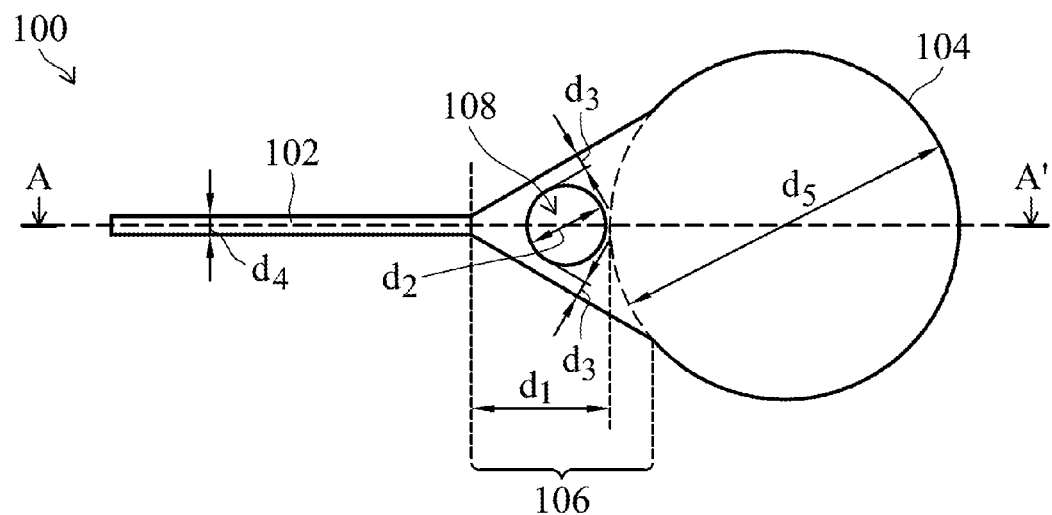
FIG. 1 is a top view of a portion of a packaging device illustrating some embodiments of the present disclosure that include a transition element having a circular hollow region disposed between a PPI line and a PPI pad.
Figure 3:
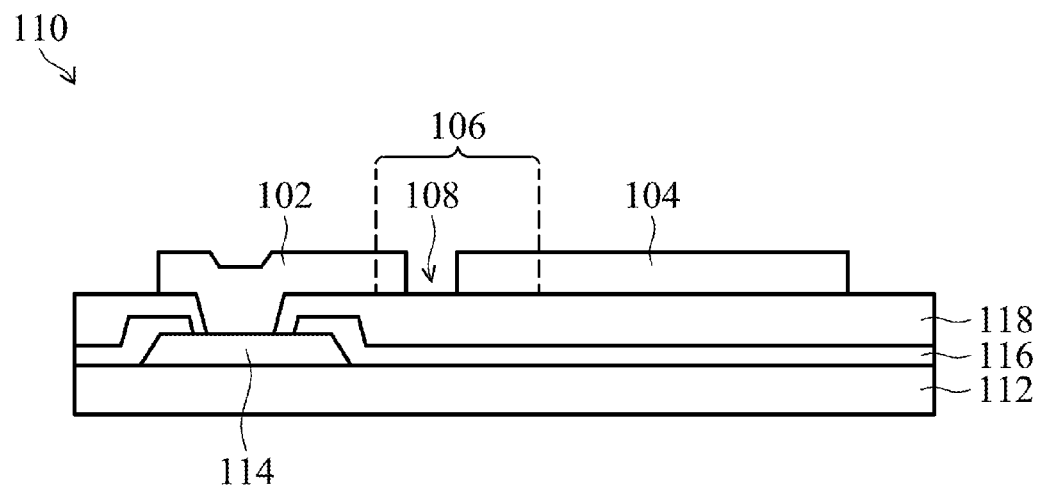
FIGS. 3 and 4 are cross-sectional views of a packaging device in accordance with some embodiments at various stages of manufacturing.

Referring first to FIG. 1, a top view of a portion 100 of a packaging device (e.g., a portion 100 of a packaging device 110 shown in FIGS. 3 and 4) in accordance with some embodiments of the present disclosure is illustrated. A cross-sectional view of the packaging device 110 at view A-A' is shown in FIG. 3. The packaging device 110 includes a transition element 106 having a hollow region 108 disposed between a PPI line 102 and a PPI pad 104. The PPI line 102, PPI pad 104, and transition element 106 comprise a conductive material and are integral to one another in some embodiments. Only one PPI line 102, PPI pad 104, and transition element 106 are shown in the drawings; however, a plurality of PPI lines 102, PPI pads 104, and transition elements 106 are formed across a surface of the packaging device 110 and are used for making electrical connections to a plurality of contact pads 114 disposed over a substrate 112.

PPI line 102, PPI pad 104, and transition element 106 comprise a redistribution layer (RDL) or other interconnect routing structures of the packaging device 110 in some embodiments, for example.

The PPI line 102 is a conductive line that extends over an underlying contact pad 114 (see FIG. 3). The PPI line 102 fills an opening in a polymer layer 118 and a passivation layer 116 and forms an electrical connection with the contact pad 114. The PPI line 102 contacts the transition element 106, and the transition element 106 contacts the PPI pad 104. The PPI line 102 may have a narrow, wide, or tapered shape. The PPI line 102 may comprise a substantially constant thickness and width. The PPI line 102 terminates at the transition element 106, and the transition element 106 terminates at the PPI pad 104; therefore, the bodies of the PPI line 102, transition element 106, and the PPI pad 104 may be formed as one piece.

The transition element 106 advantageously prevents solder or other eutectic material of a conductive material (not shown in FIG. 1; see conductive material 120 shown in FIG. 4) from forming on the PPI line 102, to be described further herein. The transition element 106 has a single hollow region 108 in the embodiments shown in FIG. 1. The hollow region 108 comprises a cave within the otherwise solid transition element 106, for example. In other embodiments, the transition element 106 comprises a plurality of hollow regions 108, which will also be described further herein.

The distance between the PPI line 102 and PPI pad 104 comprises dimension $d_1$ that comprises about 150 μm or less in some embodiments. In some embodiments, dimension $d_1$ comprises about 20 μm to about 150 μm. Alternatively, dimension $d_1$ may comprise other values. For example, in other embodiments, dimension $d_1$ is greater than 150 μm. The width of the transition element 106 is slightly greater than dimension $d_1$ due to the curved shape of the PPI pad 104 in some embodiments.

Figure 2:
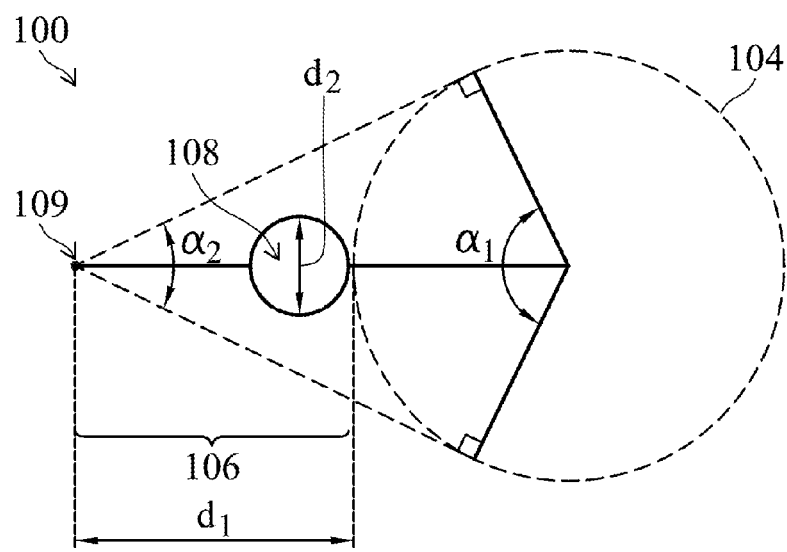
FIG. 2 illustrates several angles and dimensions of the transition element relative to the PPI pad in accordance with some embodiments.

The transition element 106 is a triangular connection comprising a shape of a triangle having a curved side proximate the PPI pad 104 in the embodiment shown in FIG. 1. Alternatively, the transition element may comprise other shapes, to be described further herein. The hollow region 108 is positioned within a central region of the transition element 106 in some embodiments, as shown. Alternatively, the hollow region 108 may be offset from the central region of the transition element 106. The hollow region 108 is spaced apart from an edge of the PPI pad 104 in some embodiments, as illustrated in FIG. 1. The hollow region 108 may be spaced apart from the edge of the PPI pad 104 by a few μm, for example. Alternatively, the hollow region 108 may be spaced apart from the PPI pad 104 by other amounts, or the hollow region 108 may directly contact the edge of the PPI pad 104, as shown in FIG. 2.

Referring again to FIG. 1, the hollow region 108 of the transition element 106 comprises a shape of a circle in the embodiment shown; however, the shape of the hollow region 108 may alternatively comprise an oval, triangle, rectangle, square, or polygon, as examples. Alternatively, the hollow region 108 may comprise other shapes. The hollow region 108 comprises a width comprising dimension $d_2$ of about 100 μm or less in some embodiments. In some embodiments, dimension $d_2$ comprises about 55 μm. Alternatively, dimension $d_2$ may comprise other values.

The transition element 106 comprises a minimum width proximate the hollow region 108 comprising dimension $d_3$, wherein dimension $d_3$ comprises about 15 μm or less in some embodiments, for example. Dimension $d_3$ comprises a width of a portion of the transition element 106 in some embodiments. The PPI line 102 comprises a width comprising dimension $d_4$, wherein dimension $d_4$ comprises about 15 μm in some embodiments, for example. In some embodiments, dimension $d_4$ comprises about 10 μm to about 100 μm, for example. Dimension $d_4$ may alternatively be greater than or less than 15 μm in some embodiments. Dimension $d_3$ may be greater than about 15 μm in embodiments wherein dimension $d_4$ is greater than about 15 μm, for example. Dimension $d_3$ is equal to or less than dimension $d_4$ in some embodiments of the present disclosure, for example. Alternatively, dimensions $d_3$ and $d_4$ may comprise other values and other relative values. Dimension $d_4$ is also referred to herein as a first width and dimension $d_3$ is also referred to herein as a second width (e.g., in some of the claims), wherein the second width is less than or equal to the first width, for example. Dimension $d_3$ being equal to or less than dimension $d_4$ advantageously ensures that a eutectic material of a conductive material 120 cannot re-flow or wet excessively and reach the PPI line 102 in some embodiments, for example.

The PPI pad 104 comprises a shape of a circle in the embodiment shown. In other embodiments, the PPI pad 104 may comprise the shape of an oval, square, rectangle, or other shapes. The PPI pad 104 comprises a width (which width comprises a diameter in embodiments wherein the PPI pad 104 comprises a circular shape) comprising dimension $d_5$. Dimension $d_5$ comprises about 200 μm in some embodiments, for example. Alternatively, dimension $d_5$ may be greater or less than 200 μm depending on the design rule for packaging device, for example. Dimension $d_5$ comprises about 180 μm to about 260 μm in other embodiments. In some embodiments, dimension $d_2$ of the hollow region 108 is about 1/10 to about 1/3 than dimension $d_5$ of the PPI pad 104. Dimension $d_5$ is also referred to herein as a first width and dimension $d_2$ is also referred to herein as a second width (e.g., in some of the claims), wherein the second width is about 1/10 to about 1/3 of the first width. In some embodiments, dimension $d_2$ is about 1/4 of dimension $d_5$, for example. In embodiments wherein dimension $d_5$ is 200 μm, dimension $d_2$ may comprise about 45 to 55 μm, as an example. In embodiments wherein the transition element 106 comprises a plurality of hollow regions 108, a total width of the hollow regions 108 may comprise about 1/3 or less of dimension $d_5$, as another example.

FIG. 2 illustrates several angles and dimensions of the transition element 106 shown in FIG. 1 relative to the PPI pad 104 in accordance with some embodiments. An angle $\alpha_1$ between edges where the transition element 106 contacts the PPI pad 104 comprises about 130 degrees in some embodiments, and an angle $\alpha_2$ at a point 109 where the transition element 106 contacts the PPI line 102 comprises about 50 degrees in some embodiments, as an example. Angle $\alpha_2$ is less than about 90 degrees in accordance with some embodiments. In some embodiments, the transition element is substantially triangle-shaped and comprises two sides coupled together that form a corner at point 109, wherein the angle $\alpha_2$ between the two sides at the corner 109 is less than about 90 degrees, for example.

Figure 4:
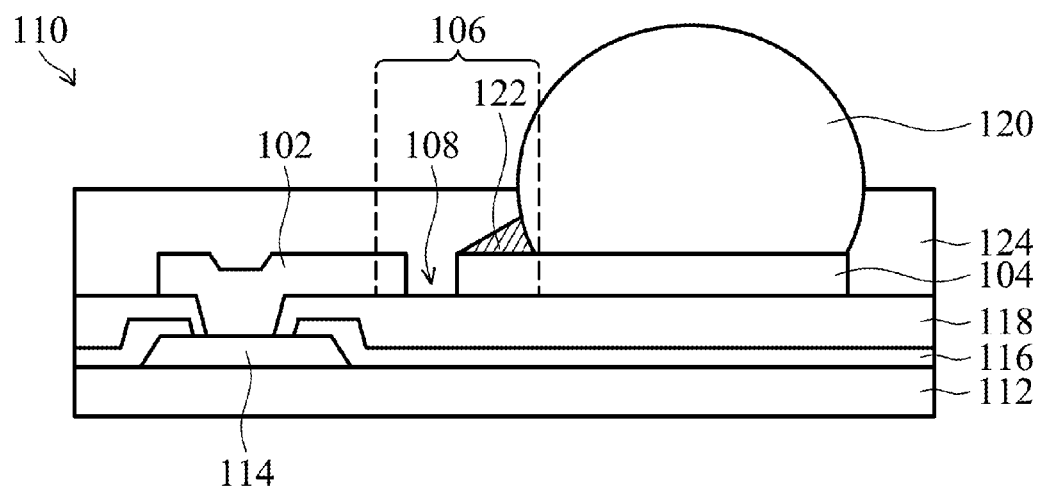

FIGS. 3 and 4 are cross-sectional views of a packaging device 110 in accordance with some embodiments at various stages of manufacturing. To manufacture the packaging device 110, first, a substrate 112 is provided. The substrate 112 may comprise silicon, other types of bulk semiconductor material, or other materials, as examples. The substrate 112 may include one or more ICs formed thereon, not shown. The IC(s) may contain active and passive devices, conductive layers, and dielectric layers according to the electrical design of the IC(s), as examples.

A conductive layer is formed as a contact pad 114 using a patterning and deposition process over the substrate 112. The contact pad 114 may comprise aluminum (Al), copper (Cu), tin (Sn), nickel (Ni), gold (Au), silver (Ag), other electrically conductive materials, or multiple layers or combinations thereof, as examples. The contact pad 114 may be formed using an electrolytic plating or electro-less plating process, for example. The size, shape, and location of the contact pad 114 are only for illustration purposes. A plurality of the contact pads 114 (not shown) are formed over the surface of the substrate 112, and the contact pads 114 may be of the same size or of different sizes.

A passivation layer 116 may be formed over the surface of the substrate 112 and over the top surface of the contact pad 114 for structural support and physical isolation. The passivation layer 116 comprises silicon nitride (SiN), silicon dioxide ($SiO_2$), silicon oxynitride (SiON), polyimide (PI), benzocyclobutene (BCB), polybenzoxazole (PBO), other insulating materials, or combinations or multiple layers thereof, as examples. An opening in the passivation layer 116 may be made by removing a portion of passivation layer 116 using a mask-defined photoresist etching process to expose a portion of the contact pad 114, while leaving another portion of the contact pad 114 covered.

A polymer layer 118 may be formed on the passivation layer 116, following the contour of the passivation layer 116 and filling a part of the opening of the passivation layer 116 over the contact pad 114. The polymer layer 118 may not completely fill the opening of the passivation layer 116 over the contact pad 114; rather, it may be patterned to form an opening to expose a portion of the contact pad 114, while covering other portions of the contact pad 114. The patterning of the polymer layer 118 may include photolithography techniques. The polymer layer 118 may be formed of a polymer, such as an epoxy, polyimide, benzocyclobutene (BCB), polybenzoxazole (PBOI), and the like, although other relatively soft, often organic, dielectric materials may also be used. Spin coating or other commonly used formation methods may be used to apply the polymer layer 118. The thickness of the polymer layer 118 may be between about 5 μm and about 30 μm, for example. Alternatively, the polymer layer 118 may comprise other dimensions.

A conductive material such as a metal is used to form the PPI line 102, PPI pad 104, and transition element 106 over the polymer layer 118, following the contour of the polymer layer 118. The PPI line 102, PPI pad 104, and transition element 106 may have a thickness of less than about 30 μm, and may comprise a thickness of about 2 μm to about 10 μm in some embodiments, as examples. The PPI line 102, PPI pad 104, and transition element 106 may comprise a metal such as Ti, Al, Ni, nickel vanadium (NiV), Cu, or combinations or multiple layers thereof, as examples. The PPI line 102, PPI pad 104, and transition element 106 may be formed using electrolytic plating, electro-less plating, sputtering, chemical vapor deposition methods, and/or photolithography processes, for example. The PPI line 102, PPI pad 104, and transition element 106 may comprise a single layer or multiple layers using an adhesion layer of Ti, TiW, Cr, or other materials, for example. Alternatively, the PPI line 102, PPI pad 104, and transition element 106 may comprise other materials and dimensions, and may be formed using other methods. The substrate 112 is connected to a number of PPI lines 102, PPI pads 104, and transition elements 106 which may electrically connect to the contact pads 114 of the substrate 112, for example.

In some embodiments, a blanket coating of conductive material may be formed over the polymer layer 118 and the exposed portion of the contact pad 114, and the conductive material is patterned using lithography, e.g., by forming a layer of photoresist (not shown) over the conductive material, patterning the photoresist, and using the photoresist as an etch mask during an etch process for the conductive material, forming the conductive material into the desired patterns and shapes of the PPI lines 102, PPI pads 104, and transition elements 106. The layer of photoresist is then removed. In other embodiments, a seed layer (also not shown) is formed over the polymer layer 118 and exposed portion of the contact pad 114, and a layer of photoresist is formed over the seed layer. The photoresist is patterned with the desired patterns and shapes of the PPI lines 102, PPI pads 104, and transition elements 106. The conductive material is then plated onto the seed layer through the patterns in the photoresist. The photoresist is removed, and the seed layer is removed from over the polymer layer 118. Alternatively, other methods may be used to form the PPI lines 102, PPI pads 104, and transition elements 106. In some embodiments, the PPI lines 102, PPI pads 104, and transition elements 106 are simultaneously formed in a single step.

A solder flux (not shown) may be applied to the PPI line 102, PPI pad 104, and transition element 106 in some embodiments to assist in the flow of the solder, such that a subsequently formed conductive material 120 shown in FIG. 4 makes good physical and electrical contact with the PPI pad 104. The flux may be applied by brushing, spraying, a stencil, or other methods, as examples. The flux generally has an acidic component that removes oxide barriers from the solder surfaces, and an adhesive quality that helps to prevent an integrated circuit from moving on the substrate surface during the packaging process.

Referring next to FIG. 4, a conductive material 120 is formed over the PPI pad 104. The PPI pad 104 is used to connect to the conductive material 120, forming a connection between the contact pad 114 to the conductive material 120 by way of the PPI line 102, the transition element 106, and the PPI pad 104. The conductive material 120 may have a larger diameter or diameter than the diameter or width comprising dimension $d_5$ of the PPI pad 104.

The conductive material 120 comprises a eutectic material and may comprise a solder bump or a solder ball, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials 120 such as solder balls may be formed from SnCu compounds as well, without the use of silver (Ag). Alternatively, lead-free solder connectors may include tin and silver, Sn—Ag, without the use of copper. The conductive material 120 may be one among an array of the conductive materials 120 formed as a grid, referred to as a "ball grid array" or "BGA". The conductive materials 120 may alternatively be arranged in other shapes. The conductive material 120 comprises a conductive ball having a shape of a partial sphere in some embodiments. Alternatively, the conductive material 120 may comprise other shapes. The conductive material 120 may also comprise non-spherical conductive connectors, for example.

The conductive material 120 is attached in some embodiments using a solder ball drop process. During the conductive material 120 mounting process, or after the conductive material mounting process, the eutectic material of the conductive material 120 may be re-flowed, and a portion of the conductive material 120 flows over a portion of the transition element 106 in some embodiments, forming a wetting region 122. In some embodiments, the wetting region 122 is formed over the entire transition element 106, not shown. In other embodiments, the wetting region 122 is not formed. Advantageously, the inclusion of the transition element 106, the hollow region 108 of the transition element 106, and the dimensions and shape of the hollow region 108 and transition element 106 result in preventing or reducing an amount of wetting region formation over the PPI line 102. In some embodiments, the wetting region 122 is not formed on the PPI line 102, for example.

A molding compound 124 is then formed over the PPI line 102, PPI pad 104, and transition element 106 and exposed portions of the polymer layer 118 in some embodiments, also shown in FIG. 4. A top portion of the molding compound 124 may be recessed so that a top portion of the conductive material 120 is exposed. Alternatively, an amount of the molding compound 124 is controlled so that the top portion of the conductive material 120 is exposed. A molding compound clamp may be applied during a curing process and a plasma treatment process of the molding compound 124 in some embodiments, for example.

In some embodiments, the transition element 106 comprises a plurality of hollow regions 108, as shown in FIGS. 5, 6, 7, 9, 10, and 11 in a top view. The hollow regions 108 may comprise the shape of a circle, an oval, a triangle, a triangle with a curved side or a curved corner, a rectangle, a rectangle with a curved side or a curved corner, a square, a square with a curved side or a curved corner, a polygon, a polygon with a curved side or a curved corner, a fragment of an annulus, other shapes, or combinations thereof, as examples.

Figure 5:
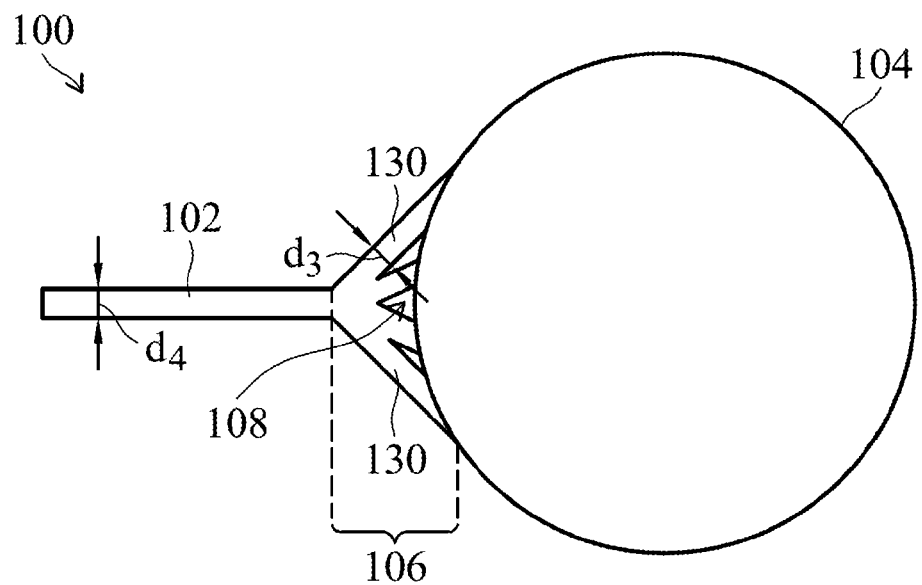
FIGS. 5 through 7 are top views of a portion of a packaging device in accordance with other embodiments, wherein the transition element and hollow regions comprise various shapes.
Figure 6:
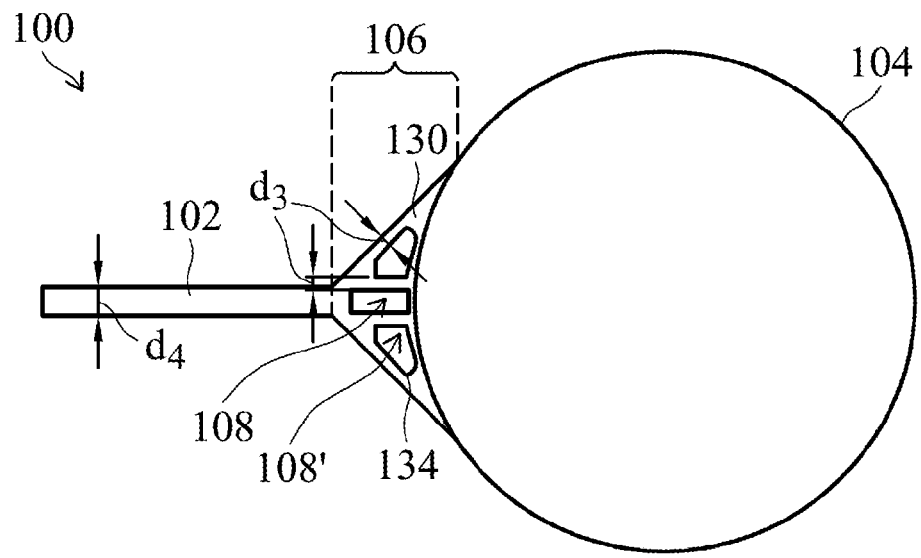
Figure 7:
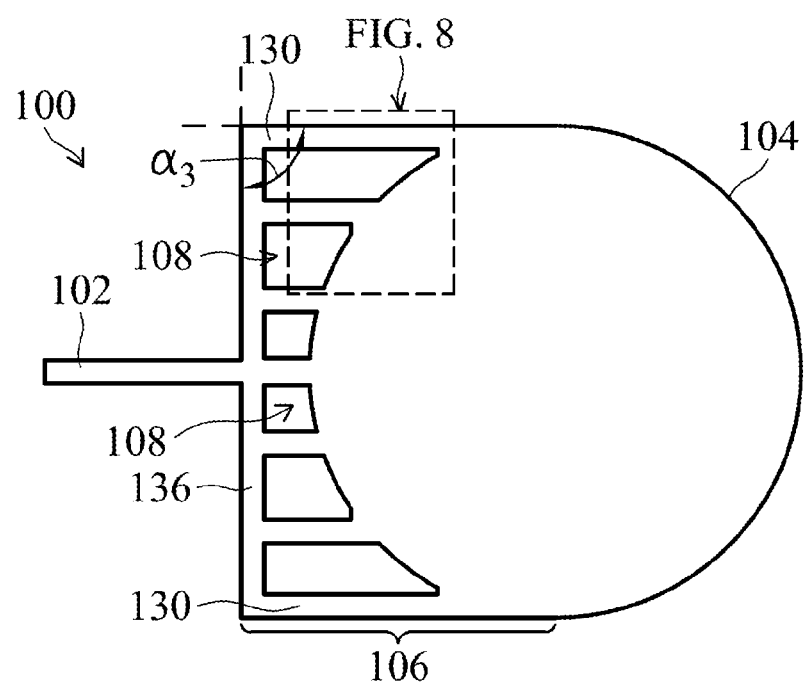

In some embodiments, the transition element 106 comprises a plurality of conjugation lines 130. The plurality of conjugation lines 130 is coupled between the PPI line 102 and the PPI pad 104. For example, FIGS. 5 through 7 are top views of a portion 100 of a packaging device in accordance with other embodiments, wherein the transition element 106 and hollow regions 108 and 108' comprise various shapes. In FIG. 5, the plurality of conjugation lines 130 is coupled between the PPI line 102 and the PPI pad 104 at a plurality of different angles with respect to the PPI line 102. Each angle is different from the other angles in the embodiment shown. Each of the conjugation lines 130 is not parallel to the PPI line 102. The hollow regions 108 comprise a shape of a triangle with a curved side, due to the curved side of the PPI pad 104. The conjugation lines 130 comprise a width comprising dimension $d_3$, wherein dimension $d_3$ is less than or equal to the width of the PPI line 102 comprising dimension $d_4$, as described for the previous embodiments.

In some embodiments, the plurality of conjugation lines 130 is coupled between the PPI line 102 and the PPI pad 104 at a plurality of different angles, and at least one of the plurality of conjugation lines 130 is positioned parallel to the PPI line 102. For example, in FIG. 6, some of the plurality of conjugation lines 130 are parallel to the PPI line 102. The two center conjugation lines 130 are positioned parallel to the PPI line 102. The other conjugation lines 130 are positioned between the PPI line 102 and the PPI pad 104 at different angles with respect to the PPI line 102. One hollow region 108 comprises a shape of a rectangle, and the other hollow regions 108' comprise a shape of a polygon with a curved side and a curved corner 134. Four conjugation lines 130 are shown in FIGS. 5 and 6; alternatively, other numbers of conjugation lines 130 may be included in the transition elements 106.

Figure 8:
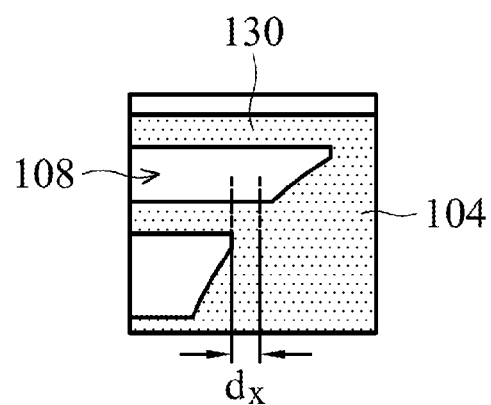
FIG. 8 is a more detailed view of a portion of FIG. 7.

In FIG. 7, each of the plurality of conjugation lines 130 is disposed substantially parallel to the PPI line 102. The transition element 106 further includes a connection line 136 disposed substantially perpendicular to the PPI line 102. The connection line 136 is coupled to the PPI line 102. Each of the plurality of conjugation lines 130 is coupled between the connection line 136 and the PPI pad 104. The conjugation lines 130 are coupled to the connection line 136 at an angle $\alpha_3$, wherein angle $\alpha_3$ is not an acute angle. Angle $\alpha_3$ is substantially about 90 degrees in some embodiments, for example. The hollow regions 108 comprise a shape of a rectangle with a curved side or a square with a curved side. Because the conjugation lines 130 are disposed at a non-acute angle $\alpha_3$, wetting regions form on the conjugation lines 130 and are resistant to flowing further onto the connecting line 136, and thus resist flowing even further onto the PPI line 102. FIG. 8 is a more detailed view of a portion of FIG. 7, illustrating the contact points of the conjugation lines 130 with the PPI pad 104. The dimension $d_x$ comprises about 1 μm or greater in some embodiments, for example. In other embodiments, dimension $d_x$ comprises about 1 μm to about 2 μm, as another example. In some embodiments, the design of dimension $d_x$ is selected to avoid an acute angle of the conjugation lines 130, in order to achieve reduced stress concentration and an improved manufacturing process.

Figure 9:
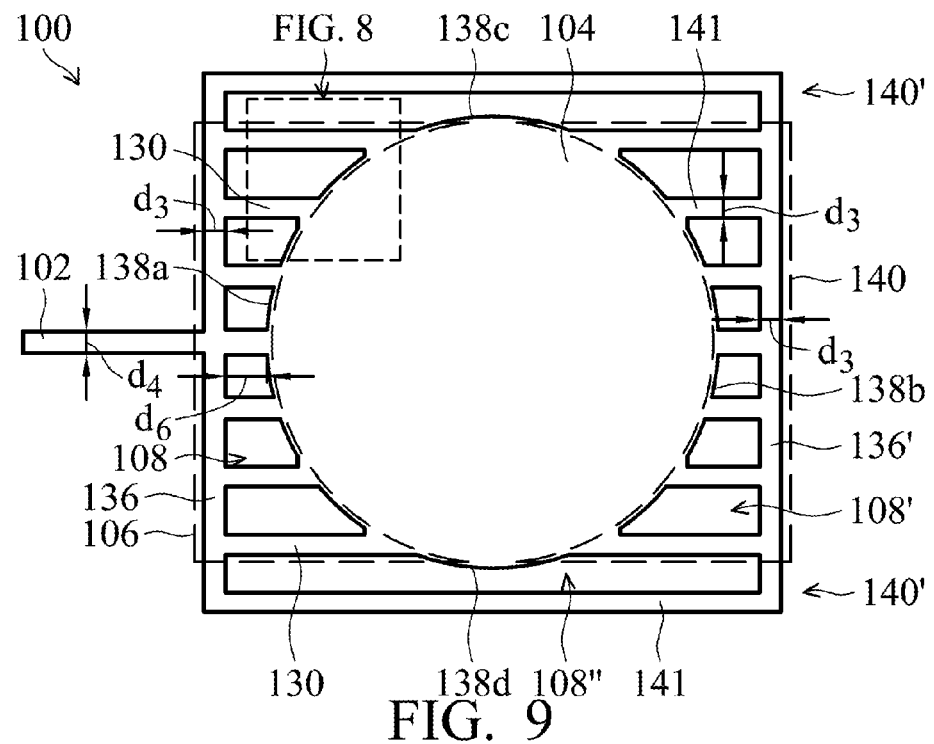
FIGS. 9 through 11 illustrate top views of embodiments of the present disclosure wherein an extension element having hollow regions is coupled to the PPI pad.
Figure 10:
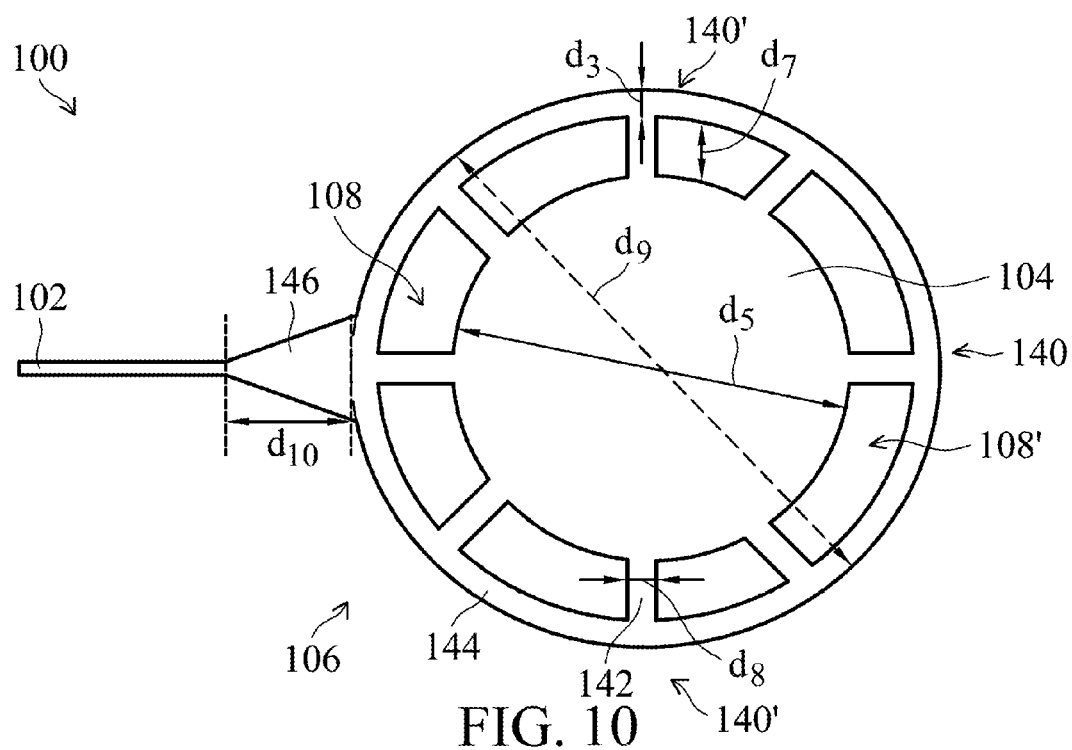
Figure 11:
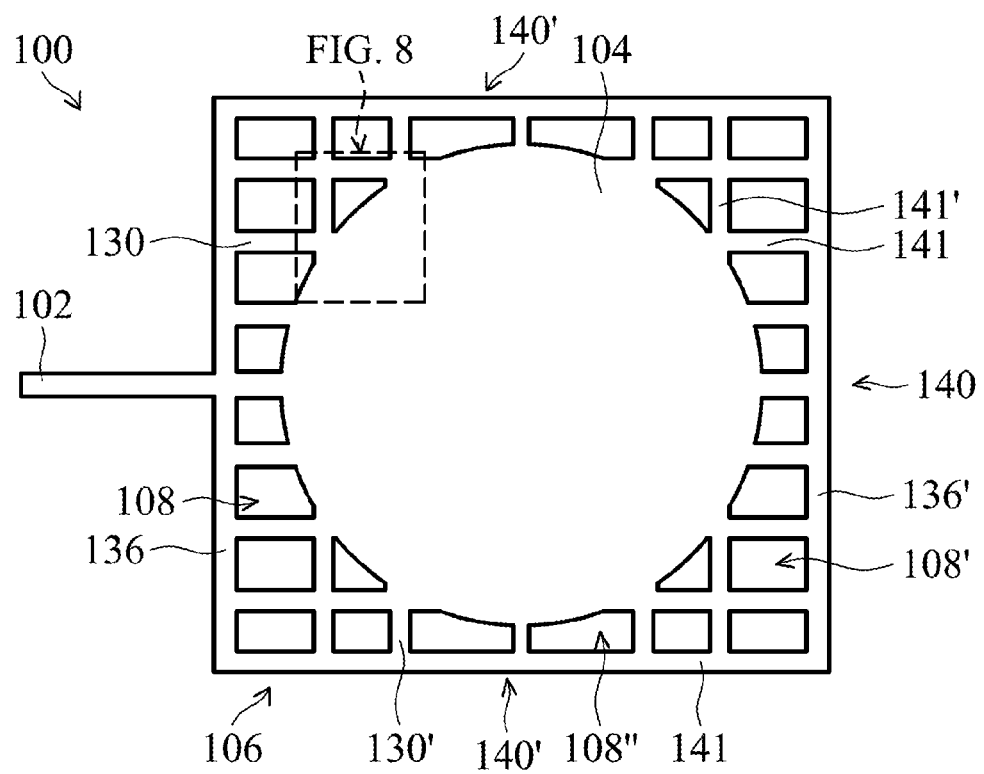

FIGS. 9 through 11 illustrate top views of embodiments of the present disclosure wherein an extension element 140 having hollow regions 108' is coupled to the PPI pad 104. For example, in FIG. 9, the embodiment shown in FIG. 7 is illustrated with the inclusion of an extension element 140. The PPI pad 138a has a first side 138a and a second side 138b opposite the first side 138a. The transition element 106 is coupled to the first side 138a of the PPI pad 104. The packaging device further includes an extension element 140 coupled to the second side 138b of the PPI pad 104. The extension element 140 includes a plurality of extension lines 141 coupled on one end to the second side 138b of the PPI pad 104 and coupled at the opposite end to a connecting line 136'. The extension element 140 comprises a hollow region 108'. In some embodiments, the extension element 140 comprises a plurality of hollow regions 108'. The hollow regions 108' have a shape of a rectangle with a curved side or a square with a curved side. The extension element 140 is formed simultaneously with the formation of the PPI lines 102, PPI pads 104, and transition elements 106 using the same method and comprising the material and thickness, in some embodiments.

In some embodiments, a portion of the extension element 140 has substantially the same shape as the transition element 106. For example, a portion of the transition element 106 may have a first shape, and a portion of the extension element 140 may have a second shape, wherein the second shape is substantially the same as the first shape, in some embodiments. Alternatively, the extension element 140 may have a different shape than the transition element 106, in other embodiments. The extension lines 141 and connecting line 136' comprise a width comprising dimension $d_3$, wherein dimension $d_3$ is less than or equal to the width of the PPI line 102 comprising dimension $d_4$, in some embodiments.

In some embodiments, the extension element 140 further includes a portion that is coupled to a third side 138c and a fourth side 138d of the PPI pad 104, as shown at 140' in FIG.

9. The third side 138*c* of the PPI pad 104 is substantially perpendicular to the first side 138*a* of the PPI pad 104, and the fourth side 138*d* of the PPI pad 104 is opposite the third side 138*c* of the PPI pad 104. A portion 140' of the extension element 140 coupled to the third side 138*c* and the fourth side 138*d* of the PPI pad 104 is coupled to the transition element 106, for example, by an extension line 141. The extension element 140' includes a hollow region 108" comprising a shape of a rectangle with a curved side. A more detailed view of a portion of the transition element 106 is shown in FIG. 8.

The extension elements 140 or 140/140' provide additional wetting regions for the flow of eutectic material of the conductive material 120, further preventing wetting onto the PPI line 102. Furthermore, the PPI line 102 may be placed closer to the PPI pad 104 in some embodiments. For example, dimension $d_6$ comprising a length of a shortest conjunction line 130 proximate the PPI line 102 comprises about 10 µm or greater in some applications. Dimension $(d_3+d_6)$ is less than dimension $d_1$ for the embodiments shown in FIG. 1, in some embodiments, for example. Alternatively, dimension $d_6$ may comprise other values.

FIG. 10 illustrates a top view of some embodiments wherein the transition element 106 and the extension element 140/140' comprise a ring member 144 coupled to the PPI line 102 and a plurality of radial members 142 coupled between the PPI pad 104 and the ring member 144. The ring member 144 comprises a shape of an annulus having a thickness comprising dimension $d_3$. Dimension $d_3$ is less than or equal to the width of the PPI line 102 comprising dimension $d_4$, in some embodiments. The radial members 142 comprise a length comprising dimension $d_7$ and a width comprising dimension $d_8$. Dimension $d_7$ comprises about 20 µm and dimension $d_8$ comprises about 10 to about 20 µm in some embodiments, as examples. The outside diameter of the ring member 144 comprises dimension $d_9$, wherein dimension $d_9$ comprises about 240 µm in some embodiments. Alternatively, dimensions $d_7$, $d_8$, and $d_9$ may comprise other values. The hollow regions 108 each comprise a shape of a fragment of an annulus in these embodiments.

The embodiments shown in FIG. 10 also include a triangle member 146 coupled between the PPI line 102 and the ring member 144. The triangle member 146 comprises a width comprising dimension $d_{10}$, wherein dimension $d_{10}$ comprises about 40 µm in some applications, for example. Alternatively, dimension $d_{10}$ may comprise other values. The triangle member 146 comprises a portion of the transition element 106 in some embodiments, for example. The triangle member 146 may also be included in the other embodiments described herein, not shown in the drawings.

FIG. 11 is a top view of some embodiments wherein the transition element 106 and extension element 140/140' comprise a grid shape. The plurality of conjugation lines 130 of the transition element 106 that are parallel to the PPI line 102 comprises a plurality of first conjugation lines 130. The transition element 106 further comprises a plurality of second conjugation lines 130'. The plurality of second conjugation lines 130' are disposed substantially perpendicular to the PPI line 102. Each of the plurality of second conjugation lines 130' is coupled to the PPI pad 104 or to one of the plurality of first conjugation lines 130. At the edges, the plurality of second conductive lines 130' is coupled to the extension line 141. Likewise, the extension element 140/140' includes a plurality of extension lines 141 that are parallel to the PPI line 102 and a plurality of second extension lines 141' that are substantially perpendicular to the PPI line 102. Each of the plurality of second extension lines 141' is coupled to the PPI pad 104 or to one of the plurality of first extension lines 141. A more detailed view of a portion of the transition element 106 is shown in FIG. 8.

Figure 12:
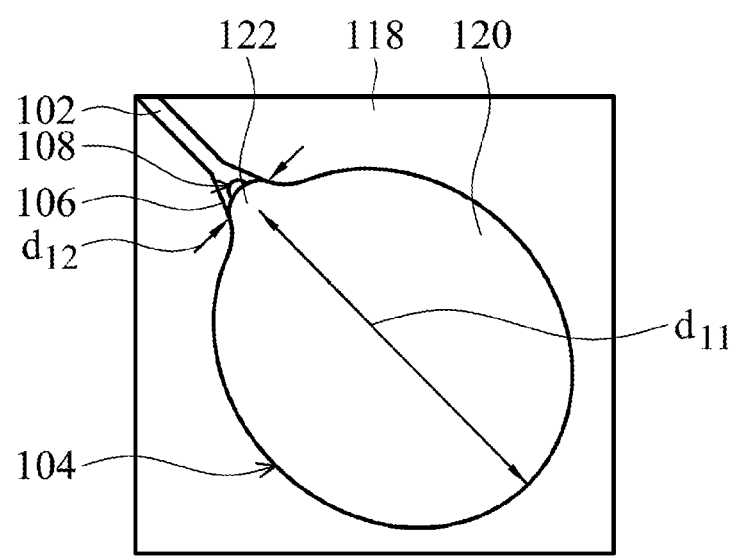
FIG. 12 is a top view of a conductive material coupled to a PPI pad that includes a transition element with a hollow region coupled thereto in accordance with some embodiments.

FIG. 12 is a top view of a conductive material 120 coupled to a PPI pad 104 that includes a transition element 106 with a hollow region 108 coupled thereto in accordance with some embodiments. The wetting region 122 does not extend past the hollow region 108. The wetting region 122 is not formed on the PPI line 102. Experimental results for a PPI pad 104 having a diameter comprising dimension $d_5$ of about 200 µm showed the formation of a conductive material 120 comprising a solder ball having a diameter comprising dimension $d_{11}$ of about 300 µm, a ball height of about 205 µm, and a wetting region 122 having a necking width comprising dimension $d_{12}$ of about 34 µm, as an example.

Figure 13:
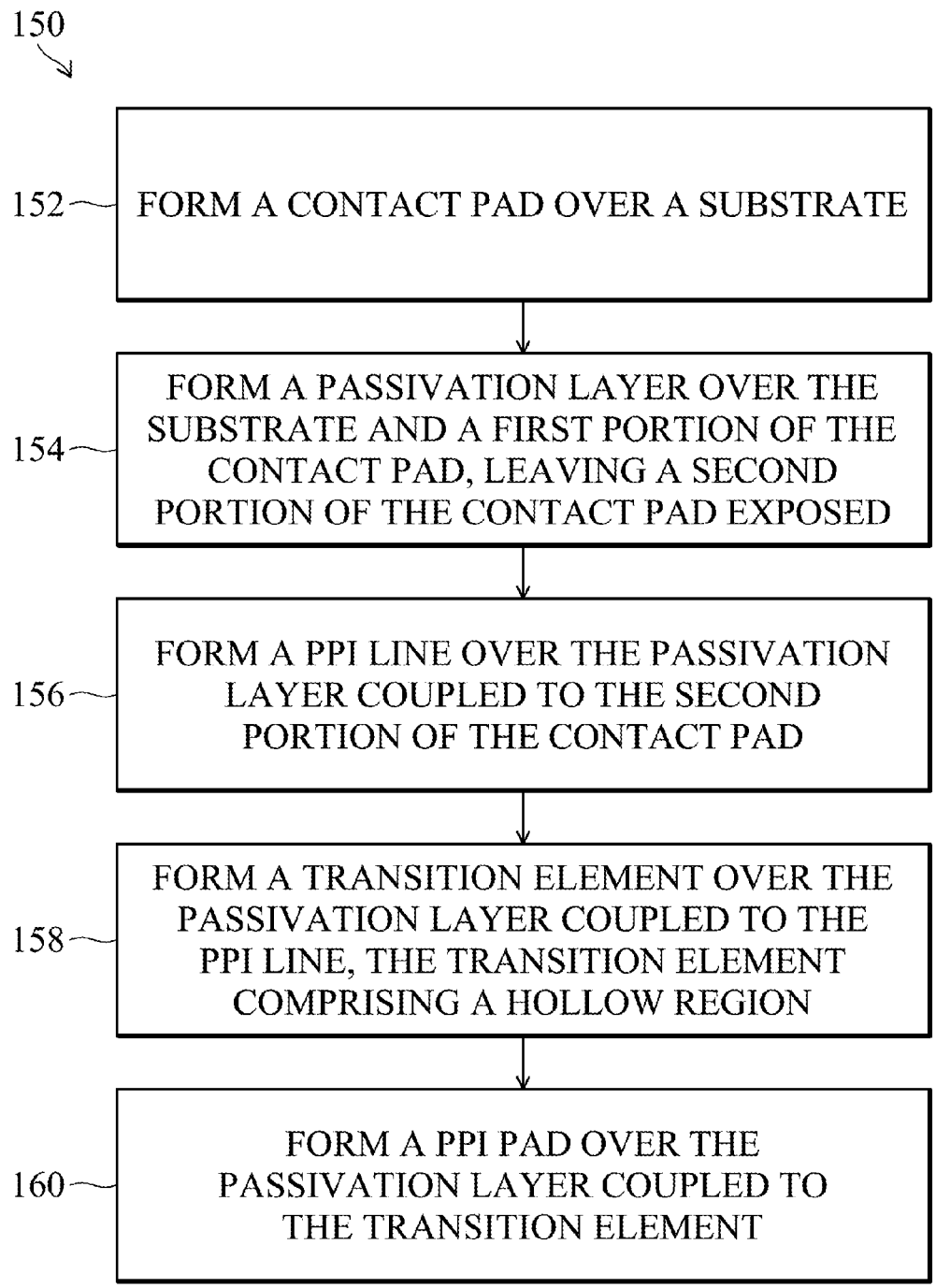
FIG. 13 is a flow chart illustrating a method of manufacturing a packaging device in accordance with some embodiments.

FIG. 13 is a flow chart 150 illustrating a method of manufacturing a packaging device 110 (see also FIG. 4) in accordance with some embodiments of the present disclosure. In step 152, a contact pad 114 is formed over a substrate 112. In step 154, a passivation layer 118 is formed over the substrate 112 and a first portion of the contact pad 114 yet leaving a second portion of the contact pad 114 exposed. In step 156, a PPI line 102 is formed over the passivation layer 118 coupled to the second portion of the contact pad 114. In step 158, a transition element 106 is formed over the passivation layer 118 coupled to the PPI line 102, the transition element comprising a hollow region 108. In step 160, a PPI pad 104 is formed over the passivation layer 118 coupled to the transition element 106.

Some embodiments of the present disclosure include methods of manufacturing packaging devices, and also include packaging devices 110 manufactured using the methods described herein.

Advantages of some embodiments of the disclosure include providing novel packaging devices 110 that include a transition element 106 in the post passivation interconnect that improves reliability by preventing or reducing solder wetting on the PPI line 102. Novel post passivation interconnect schemes that are implementable as RDLs and other types of interconnect routing in packaging devices are disclosed that include a PPI line 102, a transition element 106 including a hollow region 108 coupled to the PPI line 102, and a PPI pad 104 coupled to the transition element 106. The PPI schemes have an optimized geometry to reduce a risk of PPI line 102 cracking. The transition element 106 comprises a transition zone between the PPI line 102 and PPI pad 104 that is a sacrificial region or buffer region upon which solder wetting can occur, preventing a wetting region from forming on the PPI line 102.

The transition element 106 provides a wetting region for the eutectic material of a conductive material 120 that is later formed on the PPI pad 104. Some embodiments include an extension element 140 that also includes hollow regions 108'/108' and provides an additional wetting region. The hollow regions 108, 108', and 108" comprise a stopping point for excess eutectic material and flux, which prevents or reduces necking of the eutectic material onto the PPI lines 102. The extension element 140/140' further prevents or reduces the formation of wetting regions of eutectic material on the PPI lines 102. In some embodiments, solder ball wetting is minimized to only the PPI pad 104.

The novel PPI designs improve package reliability and prevent PPI line 102 cracking. The novel PPI designs do not require an under-ball metallization (UBM) structure and thus provide a cost savings. A process window for mounting the conductive material 120 is improved. Cracks in the PPI line 102 are prevented or reduced after the application of the molding compound 124, which is applied in some applications using a molding tool clamp which applies a force to the top of the package, for example. The transition element 106 and extension element 140/140' reduce stress on the end of the PPI line 102 trace, by controlling the conductive material 120 wetting to avoid extending the wetting region to the PPI line 102. No additional lithography masks or processes are required to implement the transition element 106 and extension element 140/140' into the packaging device interconnect routing. Furthermore, the novel packaging device 110 structures and designs are easily implementable in manufacturing and packaging process flows.

In accordance with some embodiments of the present disclosure, a packaging device includes a contact pad disposed over a substrate, and a passivation layer disposed over the substrate and a first portion of the contact pad, wherein a second portion of the contact pad is exposed. A PPI line is disposed over the passivation layer coupled to the second portion of the contact pad, and a PPI pad is disposed over the passivation layer. A transition element is disposed over the passivation layer coupled between the PPI line and the PPI pad, wherein the transition element comprises a hollow region.

In accordance with other embodiments, a packaging device includes a substrate, a contact pad disposed over the substrate, and a passivation layer disposed over the substrate and a first portion of the contact pad, wherein a second portion of the contact pad is exposed. A PPI line is disposed over the passivation layer coupled to the second portion of the contact pad, and a PPI pad is disposed over the passivation layer. A transition element is disposed over the passivation layer coupled between the PPI line and the PPI pad, the transition element comprising a hollow region. A conductive material is disposed over the PPI pad.

In accordance with other embodiments, a method of manufacturing a packaging device includes forming a contact pad over a substrate, and forming a passivation layer over the substrate and a first portion of the contact pad yet leaving a second portion of the contact pad exposed. A post passivation interconnect (PPI) line, transition element, and PPI pad are formed over the passivation layer. The PPI line is coupled to the second portion of the contact pad. The transition element is coupled to the PPI line and comprises a hollow region. The PPI pad is coupled to the transition element.

In accordance with other embodiments, a method of manufacturing a packaging device includes forming a contact pad over a substrate, forming a passivation layer over the substrate and the contact pad, etching an opening in the passivation layer to expose a first portion of the contact pad, wherein a second portion of the contact pad remains covered by the passivation layer, forming a polymer layer on the passivation layer, wherein the polymer layer fills a part of the opening in the passivation layer, forming a post passivation interconnect (PPI) line over the polymer layer, wherein the PPI line is coupled to the first portion of the contact pad, forming a PPI pad over the polymer layer, forming a transition element over the polymer layer, wherein the transition element is coupled between the PPI line and the PPI pad, and wherein the transition element comprises a hollow region, forming a conductive material comprising a eutectic material over the PPI pad, and re-flowing the eutectic material to form a wetting region over a portion of the transition element, wherein the wetting region is not formed on the PPI line.

In accordance with other embodiments, a method of manufacturing a packaging device includes forming a contact pad over a substrate, forming a passivation layer over the substrate and the contact pad, etching an opening in the passivation layer to expose a first portion of the contact pad, wherein a second portion of the contact pad is not exposed, forming a post passivation interconnect (PPI) line over the passivation layer, the PPI line being coupled to the first portion of the contact pad, forming a PPI pad over the passivation layer, forming a transition element over the passivation layer, the transition element being coupled between the PPI line and the PPI pad, and forming an extension element over the passivation layer, the extension element comprising a ring member around the circumference of the PPI pad and radial members extending from the ring member to the PPI pad.

In accordance with other embodiments, a method of manufacturing a packaging device includes forming a contact pad over a substrate, forming a passivation layer over the substrate and the contact pad, removing a portion of the passivation layer to expose a first portion of the contact pad, leaving a second portion of the contact pad covered by the passivation layer, forming a post passivation interconnect (PPI) line over the passivation layer, the PPI line having a width of about 10 to about 100 µm, forming a PPI pad over the passivation layer, forming a transition element, the transition element having a hollow region formed therein, and the transition element being coupled between the PPI line and the PPI pad, wherein a distance between the PPI line and the PPI pad comprises about 150 µm or less, forming a conductive material over the PPI pad, and re-flowing the conductive material to form a wetting region over a portion of the transition element, wherein the wetting region is not formed on the PPI line.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A method of manufacturing a packaging device, the method comprising:
   forming a contact pad over a substrate;
   forming a passivation layer over the substrate and the contact pad;

etching an opening in the passivation layer to expose a first portion of the contact pad, wherein a second portion of the contact pad remains covered by the passivation layer;

forming a polymer layer on the passivation layer, wherein the polymer layer fills a part of the opening in the passivation layer;

forming a post passivation interconnect (PPI) line over the polymer layer, wherein the PPI line is coupled to the first portion of the contact pad;

forming a PPI pad over the polymer layer;

forming a transition element over the polymer layer, wherein the transition element is coupled between the PPI line and the PPI pad, and wherein the transition element comprises a hollow region;

forming a conductive material comprising a eutectic material over the PPI pad; and re-flowing the eutectic material to form a wetting region over a portion of the transition element, wherein the wetting region is not formed on the PPI line.

2. The method of claim 1, wherein forming the transition element comprises positioning the hollow region of the transition element within a central region of the transition element.

3. The method of claim 1, wherein forming the transition element comprises forming the hollow region of the transition element having a shape selected from the group consisting essentially of a circle, an oval, a triangle, a triangle with a curved side or a curved corner, a rectangle, a rectangle with a curved side or a curved corner, a square, a square with a curved side or a curved corner, a polygon, a polygon with a curved side or a curved corner, a fragment of an annulus, and combinations thereof.

4. The method of claim 1, wherein the steps of forming the PPI line, forming the PPI pad, and forming the transition element are performed simultaneously.

5. The method of claim 1, wherein forming the transition element comprises forming the transition element having a triangular shape and forming the hollow region having a circular shape.

6. The method of claim 1, wherein the hollow region of the transition element has a first diameter and the PPI pad has a second diameter, and wherein the first diameter is about 1/10 to about 1/3 of the second diameter.

7. The method of claim 1, wherein the transition element comprises a plurality of hollow regions.

8. A method of manufacturing a packaging device, the method comprising:

forming a contact pad over a substrate;

forming a passivation layer over the substrate and the contact pad;

etching an opening in the passivation layer to expose a first portion of the contact pad, wherein a second portion of the contact pad is not exposed;

forming a post passivation interconnect (PPI) line over the passivation layer, the PPI line being coupled to the first portion of the contact pad;

forming a PPI pad over the passivation layer;

forming a transition element over the passivation layer, the transition element being coupled between the PPI line and the PPI pad; and forming an extension element over the passivation layer, the extension element comprising a ring member around the circumference of the PPI pad and radial members extending from the ring member to the PPI pad.

9. The method of claim 8, wherein forming the extension element further comprises forming openings in the extension element, the openings being separated by the radial members.

10. The method of claim 9, wherein the ring member comprises a shape of an annulus, and wherein the openings each comprise a shape of a fragment of an annulus.

11. The method of claim 8, further comprising forming a triangle member coupled between the PPI line and the ring member.

12. The method of claim 11, wherein the triangle member comprises a portion of the transition element.

13. The method of claim 8, wherein a thickness of the ring member is less than or equal to a width of the PPI line.

14. A method of manufacturing a packaging device, the method comprising:

forming a contact pad over a substrate;

forming a passivation layer over the substrate and the contact pad;

removing a portion of the passivation layer to expose a first portion of the contact pad, leaving a second portion of the contact pad covered by the passivation layer;

forming a post passivation interconnect (PPI) line over the passivation layer, the PPI line having a width of about 10 to about 100 µm;

forming a PPI pad over the passivation layer;

forming a transition element, the transition element having a hollow region formed therein, and the transition element being coupled between the PPI line and the PPI pad, wherein a distance between the PPI line and the PPI pad comprises about 150 µm or less;

forming a conductive material over the PPI pad; and re-flowing the conductive material to form a wetting region over a portion of the transition element, wherein the wetting region is not formed on the PPI line.

15. The method of claim 14, wherein the transition element comprises a minimum width proximate the hollow region, wherein the minimum width is less than or equal to the width of the PPI line.

16. The method of claim 14, wherein the hollow region comprises a width that is about 1/4 of a width of the PPI pad.

17. The method of claim 14, wherein the steps of forming the PPI line, forming the PPI pad, and forming the transition element are performed simultaneously.

18. The method of claim 14, further comprising applying a solder flux to the PPI line, the PPI pad, and the transition element before forming the conductive material over the PPI pad.

19. The method of claim 14, further comprising forming a molding compound over the PPI line, the PPI pad, and the transition element, wherein a top portion of the conductive material is exposed above a top surface of the molding compound.

20. The method of claim 14, wherein the hollow region contacts an edge of the PPI pad.

* * * * *